United States Patent
Komatsu

(10) Patent No.: US 10,121,714 B2
(45) Date of Patent: Nov. 6, 2018

(54) SEMICONDUCTOR DEVICE AND CASING OF THE SEMICONDUCTOR DEVICE

(71) Applicant: FUJI ELECTRIC CO., LTD., Kawasaki (JP)

(72) Inventor: Kousuke Komatsu, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 15/606,816

(22) Filed: May 26, 2017

(65) Prior Publication Data

US 2018/0019173 A1 Jan. 18, 2018

(30) Foreign Application Priority Data

Jul. 15, 2016 (JP) .................. 2016-140209

(51) Int. Cl.

| H01L 23/06 | (2006.01) |
|---|---|
| H01L 23/053 | (2006.01) |
| H01L 23/08 | (2006.01) |
| H01L 23/13 | (2006.01) |
| H01L 23/14 | (2006.01) |
| H01L 23/48 | (2006.01) |
| H01L 23/492 | (2006.01) |
| H01L 23/495 | (2006.01) |

(52) U.S. Cl.
CPC .......... *H01L 23/053* (2013.01); *H01L 23/08* (2013.01); *H01L 23/13* (2013.01); *H01L 23/14* (2013.01); *H01L 23/481* (2013.01); *H01L 23/492* (2013.01); *H01L 23/4951* (2013.01); *H01L 2224/01* (2013.01)

(58) Field of Classification Search
CPC ....... H01L 23/053; H01L 23/08; H01L 23/13; H01L 23/14; H01L 23/32; H01L 23/481; H01L 23/492; H01L 23/4951
USPC ......................................................... 257/684
See application file for complete search history.

(56) References Cited

U.S. PATENT DOCUMENTS

| 5,917,703 A * | 6/1999 | Murphy ................. H01L 23/32 165/80.2 |
|---|---|---|
| 8,575,745 B2 | 11/2013 | Oka et al. |
| 2006/0220213 A1 * | 10/2006 | Kondou ................ H01L 25/162 257/690 |
| 2007/0037418 A1 * | 2/2007 | Akram ................ G01R 1/0483 439/82 |
| 2012/0187554 A1 | 7/2012 | Oka et al. |

FOREIGN PATENT DOCUMENTS

| JP | 63-114156 | 5/1988 |
|---|---|---|
| JP | 2007-157745 | 6/2007 |

(Continued)

*Primary Examiner* — Tu-Tu Ho

(57) ABSTRACT

A semiconductor device includes a box-shaped casing including a ceiling wall with a first window, a semiconductor chip having an output electrode and assembled in the casing, a first conductive block disposed in the casing, and a first connection terminal being bent so as to implement an elongated U-shape. The semiconductor device is adapted for electrical connection to a circuit board having a first land. The circuit board is placed on the ceiling wall. The first window is at a position corresponding to the first land. A lower end of the first conductive block is connected to a surface of the output electrode and the first connection terminal contacts to the first conductive block.

10 Claims, 9 Drawing Sheets

(56) References Cited

FOREIGN PATENT DOCUMENTS

| JP | 2012-151019 | 8/2012 |
|----|-------------|--------|
| JP | 2014-222677 | 11/2014 |

\* cited by examiner

SEMICONDUCTOR DEVICE AND CASING OF THE SEMICONDUCTOR DEVICE

CROSS REFERENCE TO RELATED APPLICATIONS AND INCORPORATION BY REFERENCE

This application claims benefit of priority under 35 USC 119 based on Japanese Patent Application No. 2016-140209 filed on Jul. 15, 2016, the entire contents of which are incorporated by reference herein.

BACKGROUND OF THE INVENTION

1. Field of the Invention

The present invention relates to a semiconductor device and a casing of the semiconductor device.

2. Description of the Related Art

In the related art, a semiconductor device such as a semiconductor module, in which a substrate and a circuit board corresponding to the substrate are electrically connected to each other so as to implement an electrically-conductive circuit in a casing, has been known. Here, semiconductor elements—semiconductor chips—are mounted on the substrate. In recent years, smaller and smaller size of the semiconductor module with larger and larger current density is requested.

As a technique for downsizing and increasing current density, for example, JP2012-151019A discloses a power semiconductor device including a bushing that is provided on a wiring pattern of an inner substrate corresponding to a semiconductor chip, an insertion member, and a rod-shaped fitting member. The insertion member contacts with the inside of the bushing in a press-fit manner and has a recess in an outer side surface. The fitting member is fixed to a printed circuit board and has an elastic protrusion on the inner side surface. When the printed circuit board is combined with the inner substrate and the insertion member is inserted into the fitting member, the recess and the protrusion come into pressure contact with each other.

JP1988-114156A discloses a semiconductor device including a plurality of electrical contact-elements being bonded onto a substrate, the electrical contact-elements are provided on a region around a semiconductor tablet corresponding to the semiconductor chip. Because the electrical contact-elements serve as current conduction portions, the electrical contact-elements are supposed to be pressure contacted with a common contact plate. When the common contact plate, such as a printed board, is provided on the plurality of electrical contact-elements, the electrical contact-elements and the contact plate can be jointed, while facilitating a disassembling behavior between the electrical contact-elements and the contact plate.

JP2014-222677A discloses a connector for preventing plastic deformation of a contacting-portion, by molding a plate-shaped material in an S-shape so as to implement the contacting-portion—terminal—. An upper portion and a lower portion of the contacting-portion can be pressed against a substrate or a conductor so as to achieve electrical connection. JP2007-157745A discloses an electric circuit in which a semiconductor substrate and a circuit board are connected by a solder bump provided on the semiconductor substrate and a conductive spring contacts to the solder bump. According to the electric circuit, connection strength between the substrates and the circuit board increases.

In the schemes disclosed in JP2012-151019A, JP1988-114156A, JP2014-222677A, and JP2007-157745A, for example, an increase in the number of bonding wires or an increase in the number of main-current output terminals on an insulating substrate is inevitable. Therefore, it is difficult to sufficiently reduce the installation area for terminals or wires, which are used for connecting circuits in the casing of the semiconductor device.

SUMMARY OF THE INVENTION

The present invention has been made in view of the above-mentioned problems and an object of the present invention is to provide a semiconductor device and a casing of the semiconductor device, which can minimize the installation area for, for example, terminals or wires used for connecting circuits so as to reduce a size of the casing, and which can increase current density in the semiconductor device.

In order to solve the above-mentioned problems, a first aspect of the present invention inheres in a semiconductor device, which is adapted for electrical connection to a circuit board having a first land. The semiconductor device pertaining to the first aspect of the present invention includes (a) a box-shaped casing encompassing a ceiling wall, on which the circuit board is placed, the ceiling wall is provided with a first window at a position corresponding to the first land, (b) a semiconductor chip assembled in the casing, the semiconductor chip having an output electrode, (c) a first conductive block disposed in the casing, a lower end of the first conductive block being connected to a surface of the output electrode, and (d) a first connection terminal being bent so as to implement an elongated U-shape in a cross-sectional view, configured to provide a pair of opposite surfaces in the U-shape. The first connection terminal is scheduled to be connected to the first land through an upper end implemented by a bottom of the U-shape via the first window. When both sides of an upper part of the first conductive block are interposed between the opposite surfaces at a lower end implemented by a top of the U-shape, the first connection terminal contacts to the first conductive block through the opposite surfaces.

A second aspect of the present invention inheres in a casing of the semiconductor device for electrically connecting the semiconductor device to a circuit board having a land. The casing pertaining to the second aspect, includes (e) a box-shaped outer wall encompassing a ceiling wall on which the circuit board is placed, the ceiling wall is provided with a window at a position corresponding to the land, (f) a connection terminal being bent so as to implement an elongated U-shape in a cross-sectional view, configured to provide a pair of opposite surfaces in the U-shape, the connection terminal is scheduled to be connected to the land through an upper end implemented by a bottom of the U-shape via the window, and (g) a pair of supporting side-walls fixed to the outer wall, the supporting side-walls facing each other, the supporting side-walls covering the connection terminal except the upper end in the outer wall. The connection terminal is adapted for connecting to a semiconductor chip, which is scheduled to be mounted in the outer wall through the opposite surfaces at a lower end implemented by a top of the U-shape. The supporting side-walls establish a narrow constriction, which defines a smallest width between the pair of supporting side-walls, and the supporting side-walls support the connection terminal through the narrow constriction.

DETAILED DESCRIPTION OF THE PREFERRED EMBODIMENTS

Figure 1:
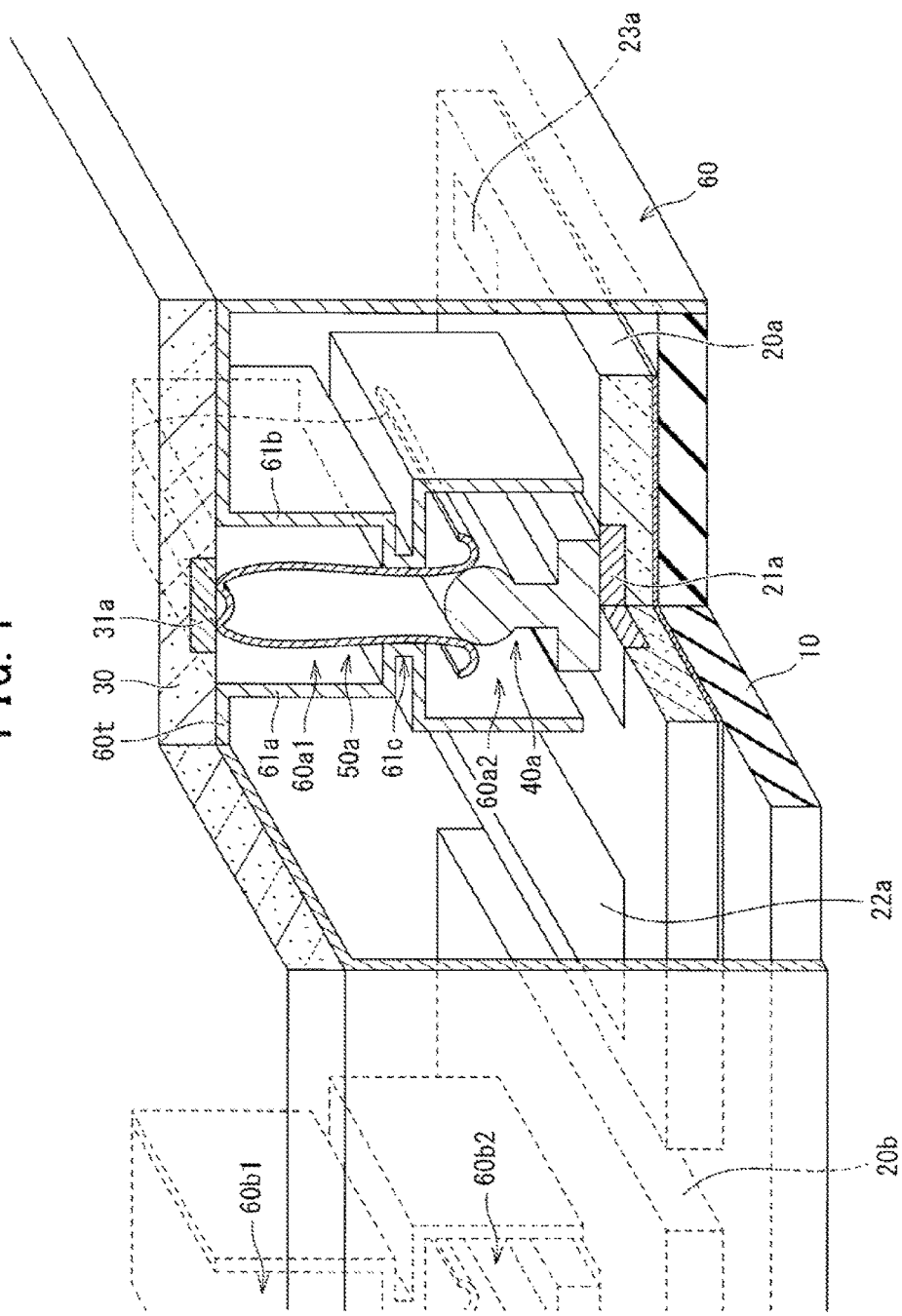
FIG. 1 is a bird's eye view (perspective view) schematically illustrating the outline of the structure of a semiconductor device according to an embodiment of the present invention, using a partial cross-sectional view.

Hereinafter, an embodiment of the present invention will be described. In the description of the following drawings, the same or similar portions are denoted by the same or similar reference numerals. It should be noted that the drawings are schematically illustrated and, for example, the relationship between a thickness and plane dimensions and the ratio of the thicknesses of each device or each member are different from the actual relationship and ratio. Therefore, the detailed thickness or dimensions need to be determined on the basis of the following description. In addition, of course, the drawings include portions having different dimensional relationships or ratios.

In the following description, a "horizontal" or "vertical" direction is simply defined for convenience of explanation and does not limit the technical scope of the present invention. Therefore, for example, when the plane of paper is rotated 90 degrees, the "horizontal" and "vertical" directions are interchanged. When the plane of paper is rotated 180 degrees, the "left" is changed to the "right" and the "right" is changed to the "left".

<Structure of Semiconductor Device>

As illustrated in FIG. 1, a semiconductor device according to an embodiment of the present invention includes a box-shaped casing 60 that includes a ceiling wall 60t on which a circuit board 30 having a land 31a is placed and a window which is provided in the ceiling wall at a position corresponding to the land 31a. Furthermore, the semiconductor device pertaining to the embodiment of the present invention includes a semiconductor chip 20a and a conductive block 40a, which are accommodated in the casing 60. The semiconductor chip 20a has an output electrode 21a, and a lower end of the conductive block 40a is connected to the surface of the output electrode 21a.

In addition, the semiconductor device pertaining to the embodiment includes a connection terminal 50a having a U-shaped elongated portion in a cross-sectional view. The U-shape is implemented by bending a plate toward opposite surface of the connection terminal 50a. An upper end of the connection terminal 50a is connected to the land 31a through a window of the casing 60, the upper end corresponds to the bottom of the U-shaped portion. Both sides of an upper part of the conductive block 40a are interposed between the opposite surfaces allocated at a lower end implemented by a top of the U-shaped portion, and the connection terminal 50a contacts with the conductive block 40a through the opposite surfaces.

An insulating substrate 10 is, for example, a direct copper bond (DCB) substrate or an aluminum substrate. The insulating substrate 10 is a base member having an area to which conductive patterns, such as copper films, are provided. A semiconductor chip is mounted on the base member so that a circuit is implemented. The insulating substrate 10 can be used to achieve a semiconductor device that is a so-called "copper-baseless type" and is directly fixed to a cooler, without passing through a cooling base, in order to reduce costs and thermal resistance.

For example, a reverse-conducting (RC) insulated-gate bipolar transistor (IGBT), in which a freewheeling diode (FWD) is integrated in a same chip of IGBT, can be used for a semiconductor element serving as the semiconductor chip 20a. Two semiconductor chips 20a, 20b illustrated in FIG. 1 as examples have a rectangular shape in a plane pattern. The output electrode 21a, an electrode 22a adapted for open-emitter configuration (hereinafter called "the open-emitter electrode 22a"), and a gate electrode 23a are provided on a top surface of the semiconductor chip 20a. Illustration of stacked structure or arrangement of semiconductor regions in each of the semiconductor chips 20a, 20b is omitted.

The pattern of the output electrode 21a and the open-emitter electrode 22a can be delineated as rectangular areas in a plane pattern. The output electrode 21a and the open-emitter electrode 22a are provided on the top surface of the semiconductor chip 20a so as to extend in parallel along a depth direction from the lower left side to the upper right side in FIG. 1, while a gap is arranged between the output electrode 21a and the open-emitter electrode 22a. The gate electrode 23a is arranged on the top surface of the semiconductor chip 20a at a location opposing to the open-emitter electrode 22a, providing the output electrode 21a in between the gate electrode 23a and the open-emitter electrode 22a. A solder-plating is performed for the surface of each of the output electrode 21a, the open-emitter electrode 22a, and the gate electrode 23a. The conductive block 40a is electrically connected to the surface of the output electrode 21a by, for example, soldering.

Connection members, such as lead frames, are provided on the surface of each of the open-emitter electrode 22a and the gate electrode 23a by, for example, soldering, and the open-emitter electrode 22a and the gate electrode 23a are electrically connected to other regions of the insulating substrate 10. No bonding wires are used on the insulating substrate 10 of the semiconductor device pertaining to the embodiment.

The outer wall of the casing 60 is made of an insulating material, such as a resin. Here, the overall structure of the casing 60 corresponds to "casing of the semiconductor device" in the present invention. The outer wall of the casing 60 has, for example, a rectangular parallelepiped shape and is a box-shaped, and the box has an open window. The insulating substrate 10 is fitted as the bottom plate to the bottom opening of the casing 60, and the casing 60 and the insulating substrate 10 are merged.

Figure 2:
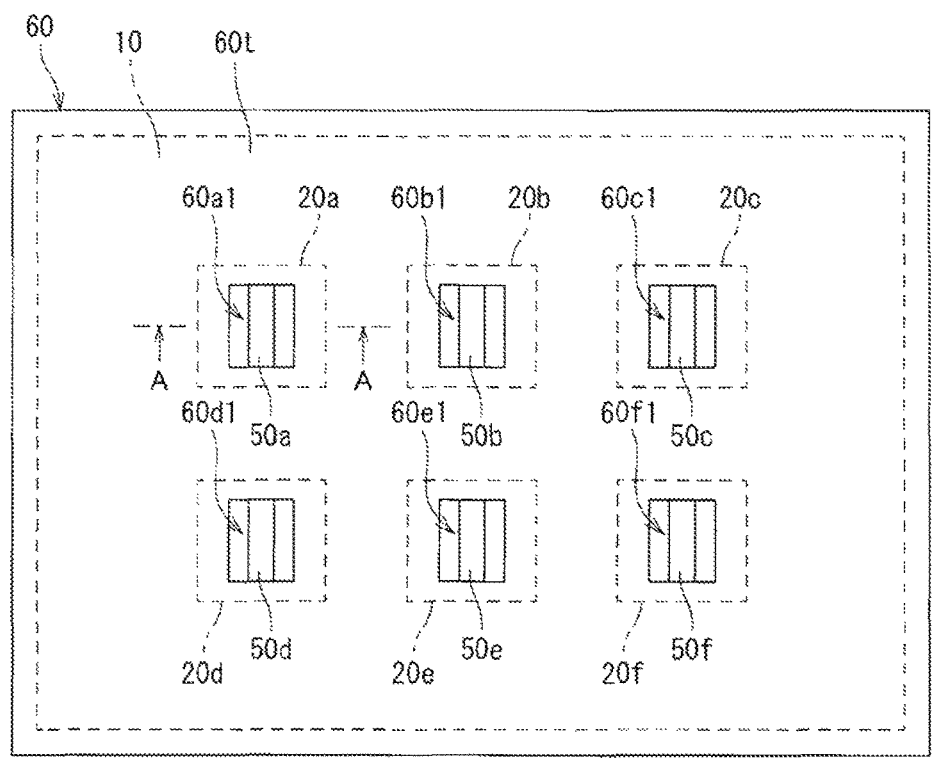
FIG. 2 is a plan view schematically illustrating the outline of the structure of the semiconductor device pertaining to the embodiment of the present invention in a state in which an upper circuit board is removed.

As illustrated in FIG. 1, the circuit board 30 electrically connected to the semiconductor chip 20a is placed on the ceiling wall 60t of the casing 60. As illustrated in FIG. 2, a plurality of windows, each of which is defined by a rectangular outer-edge in a plane pattern, are provided in the ceiling wall 60t of the casing 60. FIG. 2 illustrates a top surface of the casing 60 in a state in which the circuit board 30 is removed. As a whole, the semiconductor device pertaining to the embodiment is a semiconductor module, which assembles six semiconductor chips 20a~20f.

As illustrated in FIG. 1, the outer wall of the casing 60 is provided with a pair of supporting side-walls 61a, 61b that extend downward from a long side of the rectangle, which defines the window of the casing 60, to the insulating substrate 10. A narrow constriction 61c is formed in the middle of supporting side-walls 61a, 61b so that a pair of portions of the narrow constriction 61c faces each other, in between the supporting side-walls 61a, 61b. Then, the connection terminal 50a is supported by the pair of portions of the narrow constriction 61c in the casing 60, when the connection terminal 50a is inserted between the supporting side-walls 61a, 61b. The pair of supporting side-walls 61a, 61b are respectively bent at a right angle so as to implement a cross-sectional shape of a crankshaft, such that the narrow constriction 61c, which is implemented by the facing portions, can be assigned as a crankpin. That is, in the cross-sectional shape, the upper-side of the plate-shaped portion, which extends in the vertical direction in the pair of supporting side-walls 61a, 61b, may correspond to an upper journal of the crankpin in a structure of the crankshaft. Similarly, the lower-side of the plate-shaped portion, which extends in the vertical direction, may correspond to a lower journal of the crankpin. The pair of supporting side-walls 61a, 61b can be made of the same material as the casing 60 and can be manufactured integrally with the casing 60 by, for example, resin extrusion molding.

Because the geometry of the pair of supporting side-walls 61a, 61b are designed so as to mate to a pair of side walls of the U-shaped connection terminal 50a, the supporting side-walls 61a, 61b can support the pair of side walls of the connection terminal 50a from the outside. In a topology such that the pair of supporting side-walls 61a, 61b are provided so as to face each other, a first containment space 60a1 and a second containment space 60a2 are formed in the casing 60 side by side in the vertical direction. Since the first containment space 60a1 on the upper side has a rectangular parallelepiped shape, an upper part of the connection terminal 50a is stored in the first containment space 60a1. And, as the second containment space 60a2 on the lower side has a rectangular parallelepiped, a lower part of the connection terminal 50a and the conductive block 40a are stored in the second containment space 60a2.

The lower ends of the pair of supporting side-walls 61a, 61b are separated from the surface of the semiconductor chip 20a in order to prevent the damage of the surface of the semiconductor chip 20a. FIG. 2 illustrates six first containment spaces 60a1~60f1 and six connection terminals 50a~50f that are exposed through windows which are assigned in the ceiling wall 60t at positions corresponding to six semiconductor chips 20a~20f.

Figure 3:
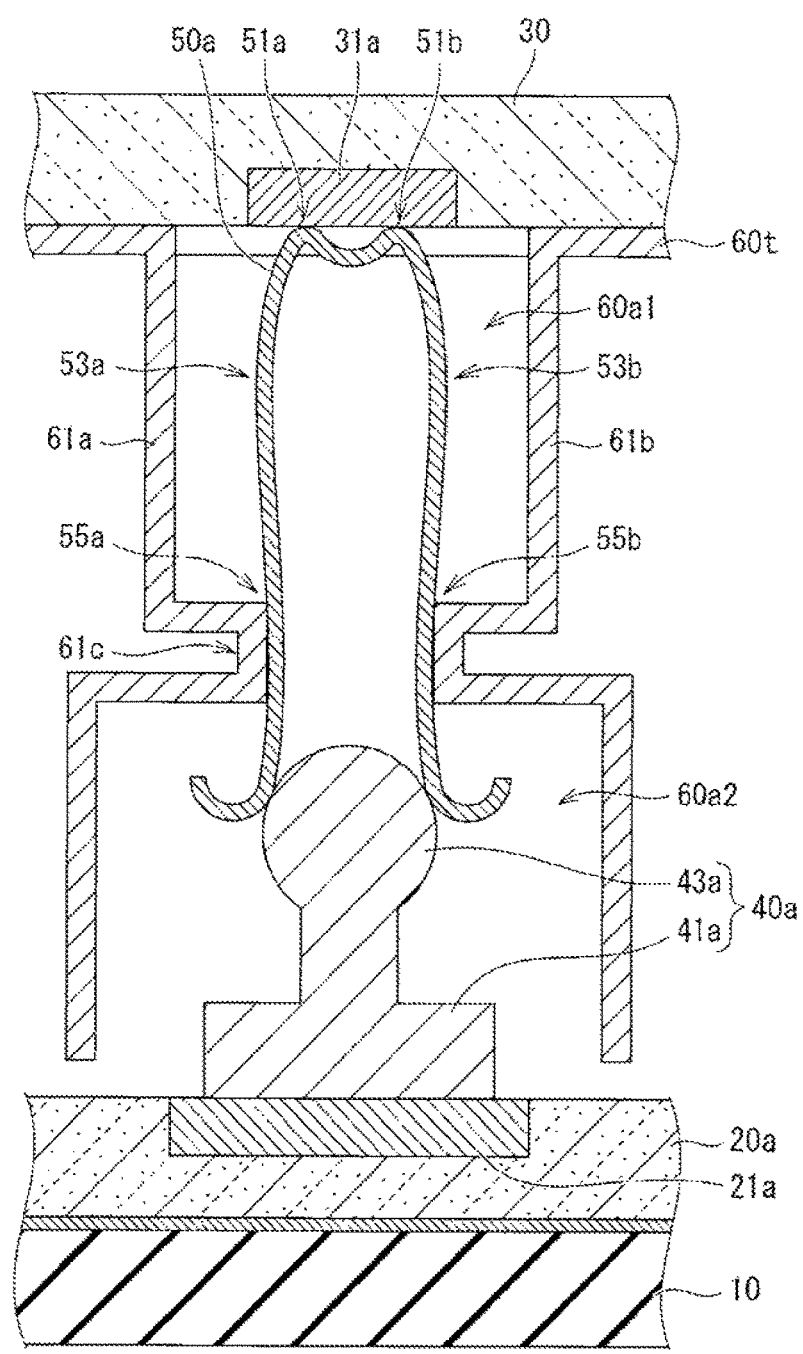
FIG. 3 is a cross-sectional view taken along the line A-A of FIG. 2.

Next, the conductive block 40a, the connection terminal 50a, and the pair of supporting side-walls 61a, 61b will be described in detail with reference to FIG. 3. The conductive block 40a can be made of metal such as copper. The conductive block 40a includes a base portion 41a and a projecting portion 43a provided on the base portion 41a. The base portion 41a has a prismatic topology with inverted T-shape in a cross-sectional view, and the projecting portion 43a has a cylindrical shape. As illustrated in FIGS. 1 and 3, four sides of a rectangular bottom surface of the base portion 41a are disposed respectively at positions slightly inside the rectangular outer-edge of the output electrode 21a, the rectangular outer-edge is defined at the surface of the output electrode 21a.

That is, the bottom surface of the base portion 41a of the conductive block 40a is plane-bonded with a large area to the surface of the output electrode 21a. An outer surface of the projecting portion 43a is curved. Because inner wall surfaces in an hollow space in the connection terminal 50a contact with the outer surface, respectively, a pair of linear-shape contact-regions or a pair of planar-shape contact-regions may be formed on the outer surfaces at both sides of the projecting portion 43a.

As illustrated in FIG. 3, the pair of supporting side-walls 61a, 61b continuously extend downward substantially in the vertical direction from a portion of the region of the ceiling wall 60t of the casing 60, and thereafter, the supporting side-walls 61a, 61b are bent in a crankshaft shape between upper and lower ends of the supporting side-walls 61a, 61b. The pair of supporting side-walls 61a, 61b has substantially the same thickness between the upper and lower ends, and the supporting side-walls 61a, 61b implement a bilaterally symmetric cross-sectional shape about a central axis between the supporting side-walls 61a, 61b. The upper ends of the pair of supporting side-walls 61a, 61b are fixed to the ceiling wall 60t of the casing 60, and the pair of supporting side-walls 61a, 61b cover, from both sides, the portions other than the upper end of the connection terminal 50a.

In the pair of supporting side-walls 61a, 61b, the narrow constriction 61c is provided substantially at the middle in the vertical direction between the first containment space 60a1 and the second containment space 60a2. The narrow constriction 61c is a portion achieving the smallest width, the width is measured between the pair of supporting side-walls 61a, 61b. The narrow constriction 61c is located at a vertical position higher than the contact sites between the connection terminal 50a and the conductive block 40a.

The connection terminal 50a is inserted into a region that passes through the first containment space 60a1, the inside of the narrow constriction 61c, and the second containment space 60a2 along the vertical direction. The pair of supporting side-walls 61a, 61b contacts with the connection terminal 50a from both sides at the narrow constriction 61c. Ascribable to the pressures applied by the lower conductive block 40a, the land 31a of the upper circuit board 30, and the narrow constriction 61c of the pair of supporting side-walls 61a, 61b, the inserted connection terminal 50a is firmly held in the casing 60.

For example, the connection terminal 50a can be manufactured by bending an elastic metal plate at the center in a longer direction so as to form a U-shape or a horseshoe shape, which defines a concave encompassing a narrow hollow space directing along the vertical direction such that the opening of the hollow space is allocated at downward position. As illustrated in FIG. 3, the shape of the connection terminal 50a is bilaterally symmetric about a central vertical line, and portions other than the upper end of the connection terminal 50a are covered by the casing 60. The connection terminal 50a is made of, for example, a copper alloy. The connection terminal 50a has predetermined elastic force. A plating process, such as silver plating, is performed on the outer and the inner wall surfaces of the U-shaped connection terminal 50a in order to protect the outer and inner wall surfaces.

A first contact protrusion 51a and a second contact protrusion 51b are provided side by side at the upper end of the connection terminal 50a along the width direction of the hollow space in the connection terminal 50a. The first contact protrusion 51a and the second contact protrusion 51b are two protrusions that project toward the circuit board 30 and form electrical contact-elements to the land 31a of the circuit board 30. A recess is formed between the first contact protrusion 51a and the second contact protrusion 51b. The recess at the bottom of the connection terminal 50a implements an inverted W-shape with the first contact protrusion 51a and the second contact protrusion 51b. The number of protrusions forming the electrical contact-elements is not limited to two, and more than three protrusions can be selected.

In the left side wall of the U-shaped connection terminal 50a illustrated in FIG. 3, a first curved portion 53a that is continuous with the first contact protrusion 51a is provided on the side of the first contact protrusion 51a, the side is opposite to the second contact protrusion 51b. The first curved portion 53a is swelling and curved from the first contact protrusion 51a toward the supporting side-wall 61a, the supporting side-wall 61a is disposed at a side close to the first curved portion 53a. A first slide portion 55a that is continuous with the first curved portion 53a is provided on the lower side of the first curved portion 53a.

The first slide portion 55a is a portion on which the outer wall surface of the U-shaped connection terminal 50a slides with the inner wall surface of the narrow constriction 61c in the supporting side-wall 61a, which is disposed at the side close to the first slide portion 55a. A lower region of the first slide portion 55a contacts with the outer surface of the upper part of the projecting portion 43a of the conductive block 40a in the second containment space 60a2.

Focusing to the structure at the left side of the contacting site between the connection terminal 50a and the conductive block 40a illustrated in FIG. 3, the left lower part of the connection terminal 50a is curved so as to be away from the conductive block 40a, in between the contacting site, which is formed between the connection terminal 50a and the conductive block 40a, and the left lower end of the plate-shaped connection terminal 50a. Namely, the left lower end of the connection terminal 50a is curved back upward. Therefore, in a region below the contacting site between the connection terminal 50a and the conductive block 40a, there is no curved portion that protrudes toward the conductive block 40a.

As illustrated on the left side of FIG. 3, along a side wall extending from the first contact protrusion 51a to the contacting site to the conductive block 40a, one route of the conduction paths of a current flowing between the output electrode 21a of the semiconductor chip 20a and the land 31a of the circuit board 30 is established through the first curved portion 53a and the first slide portion 55a.

In the right side wall of the U-shaped connection terminal 50a in FIG. 3, the second curved portion 53b that is continuous with the second contact protrusion 51b and the second slide portion 55b that is continuous with the second curved portion 53b are provided on the side of the second contact protrusion 51b which is opposite to the first contact protrusion 51a. Because the shape and arrangement which are implemented by the second curved portion 53b and the second slide portion 55b are bilaterally symmetric with the shape and arrangement which are implemented by the first curved portion 53a and the first slide portion 55a, the description of the structure of the second curved portion 53b and the second slide portion 55b is omitted and not repeated.

Along a side wall extending from the second contact protrusion 51b to the contacting site to the conductive block 40a illustrated on the right side of FIG. 3, another route of the conduction paths of the current flowing between the output electrode 21a of the semiconductor chip 20a and the land 31a of the circuit board 30 is established through the second curved portion 53b and the second slide portion 55b.

Figure 6:
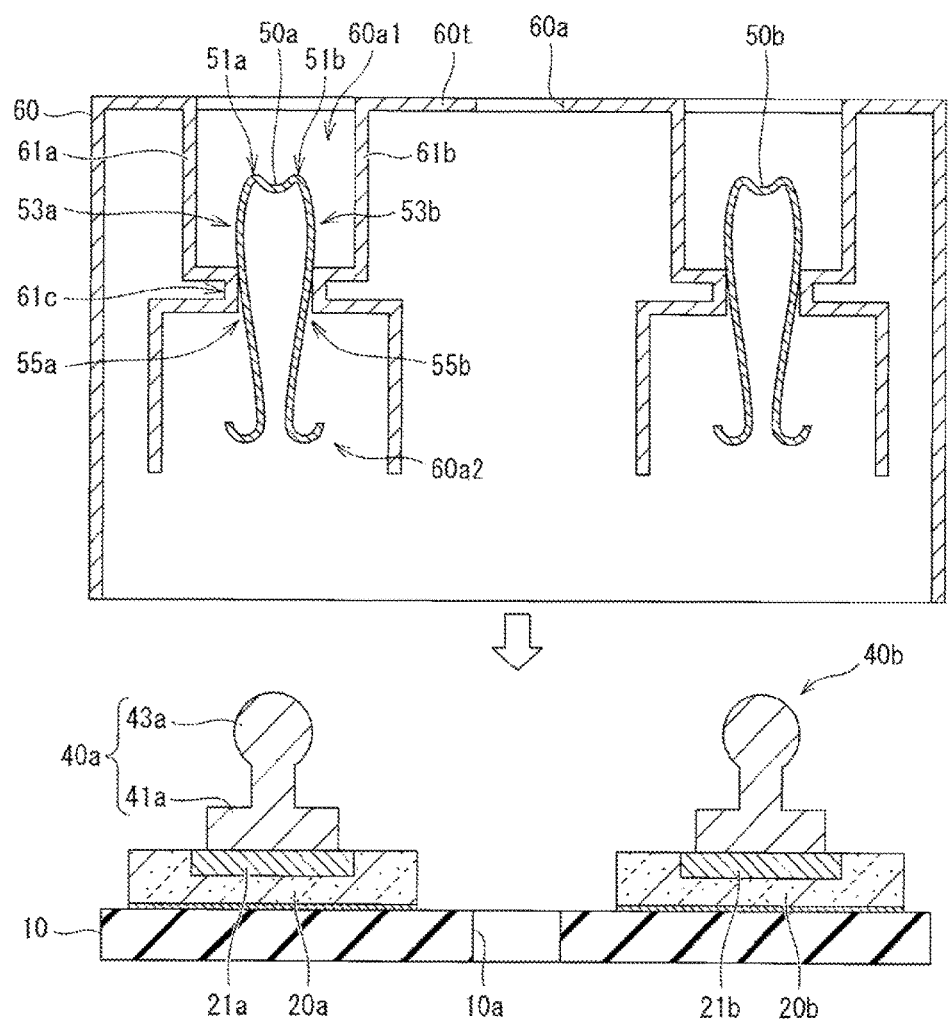
FIG. 6 is a subsequent process-flow cross-sectional view illustrating the method for manufacturing the semiconductor device pertaining to the embodiment, after the process stage illustrated in FIG. 5.

A swelling portion (53a, 53b), which swells outward, is implemented by the first curved portion 53a and the second curved portion 53b of the connection terminal 50a in the pair of side walls of the connection terminal 50a. In a state in which the connection terminal 50a is not fitted to the conductive block 40a, as illustrated in FIG. 6, a portion below the swelling portion (53a, 53b) of the connection terminal 50a is continuously narrowed toward downward so as to implement a tapered shape as a whole.

The swelling portion (53a, 53b) has a portion in which a length—width—between the outer wall surfaces of the opposite side walls, measured at the same height position, is greater than a gap—width—measured horizontally between the opposite walls of the narrow constriction 61c of the pair of supporting side-walls 61a, 61b. That is, the swelling portion (53a, 53b) of the connection terminal 50a protrudes outward from the narrow constriction 61c in the supporting side-wall along the width direction. Therefore, when the connection terminal 50a is inserted into the casing 60 from the first containment space 60a1 side, because the swelling portion (53a, 53b) is caught by the narrow constriction 61c, the connection terminal 50a does not fall downward, being supported by the narrow constriction 61c.

The width of the hollow space in the connection terminal 50a is equal to or slightly less than the diameter of the circle implemented by the projecting portion 43a of the conductive block 40a. In a state in which the connection terminal 50a is fitted to the conductive block 40a, the hollow space is pressed and widened by the projecting portion 43a, and then, a portion between a contacting site of the lower part of the connection terminal 50a with the conductive block 40a and the swelling portion (53a, 53b) is also widened.

When the portion between the contacting site to the conductive block 40a and the swelling portion (53a, 53b) is widened, at least one linear portion or one planar contact protrusion is formed between a portion of side walls of the connection terminal 50a and the inner surface of the narrow constriction 61c in the supporting side-walls 61a, 61b, and therefore, the connection terminal 50a contacts with the narrow constriction 61c. Force to press the inner wall of the connection terminal 50a is applied to the contact site, between the connection terminal 50a and the conductive block 40a, from the conductive block 40a when the connection terminal 50a contacts to the narrow constriction 61c.

The dimensions of the connection terminal 50a and the conductive block 40a are designed such that the connection terminal 50a contacts with only at a predetermined site of the outer surface, the predetermined site corresponds to the upper half of the circle implemented by the projecting portion 43a of the conductive block 40a, and that any contacting site to the conductive block 40a is not located in the lower position of the circle implemented by the projecting portion 43a.

According to the semiconductor device pertaining to the embodiment, the output electrode 21a on the semiconductor chip 20a and the land 31a of the circuit board 30 are connected only at an area defined in the inside of the output electrode 21a, wherein the position of the land 31a is arranged at a position corresponding to the output electrode 21a. In contrast, in the related earlier technology, for example, in addition to the semiconductor chip 20a, connection means for output terminals, such as wire bonding pads, which are separately provided at sites around the position where the semiconductor chip 20a is mounted, are required on the insulating substrate 10.

However, according to the semiconductor device pertaining to the embodiment, the connection portion for an output terminal can be intensively provided on the surface of the semiconductor chip 20a. Therefore, it is possible to reduce the size of the insulating substrate 10 and to improve flexibility in a circuit pattern on the insulating substrate 10. As a result, it is possible to reduce the assembling area of the connection terminal 50a and a large amount of current can flow. It is possible to downsize a semiconductor device compactly, while further increasing current density.

According to the semiconductor device pertaining to the embodiment, as the conductive block 40a that extends along the surface of the output electrode 21a is used as the conduction path of an output current, a large heat radiation area for cooling can be ensured by the conductive block 40a, compared with, for example, bonding wires. Therefore, it is possible to improve the lifespan of products, and it is possible to improve power cycle capability of the products.

According to the semiconductor device pertaining to the embodiment, because the surface of the base portion 41a of the conductive block 40a is bonded to a large area on the surface of the output electrode 21a, only one connection terminal 50a is enough to flow a sufficiently large amount of current. For example, it is not necessary to connect the semiconductor chip 20a and the circuit board 30 using a plurality of rod-shaped connection terminals on the surface of the output electrode 21a.

According to the semiconductor device pertaining to the embodiment, since the connection terminal 50a has a horseshoe shape or a U-shape, two conduction paths of an output current are formed. Therefore, the resistance of the connection terminal 50a for delivering a main-current can be reduced to about half of the earlier semiconductor device, because, in the earlier semiconductor device, one contact is formed so as to implement a single conduction path. In other words, according to the semiconductor device pertaining to the embodiment, assuming that the same amount of heat is generated when a current flows through the connection terminal 50a, two times more of current can be flowed than the amount of current when one conduction path is formed. Therefore, it is possible to manufacture a product that can achieve high current density, even when the size is the same as the product in the related earlier technology.

According to the semiconductor device pertaining to the embodiment, because two electrical contact-elements, that is, the first contact protrusion 51a and the second contact protrusion 51b are provided at the upper end of the connection terminal 50a such that the bottom of the U-shaped connection terminal 50a implements an inverted W-shape, the circuit board 30 and the connection terminal 50a can be connected via the electrical contact-elements, without using, for example, wire bonding scheme. Therefore, it is possible to prevent a contact failure, and the reliability of electrical connection between the connection terminal 50a and the circuit board 30 can be improved.

According to the semiconductor device pertaining to the embodiment, because the left and right ends of the connection terminal 50a, which are located below the contacting site between the connection terminal 50a and the conductive block 40a, are curved outward, any protruding portion that bends toward the conductive block 40a is not provided below the contacting site between the connection terminal 50a and the conductive block 40a. Therefore, any extra portion that will hinder the entrance of the conductive block 40a does not exist. As a result, even when the connection terminal 50a slides in the vertical direction inside the pair of supporting side-walls 61a, 61b, the left lower end of the connection terminal 50a and right lower end of the connection terminal 50a do not interfere with the conductive block 40a and the connection terminal 50a can be smoothly moved.

According to the semiconductor device pertaining to the embodiment, the outer surface of the projecting portion 43a of the conductive block 40a is curved. Therefore, when the hollow space in the connection terminal 50a is fitted to the projecting portion 43a, the inner surface at the hollow space can smoothly slide on the outer surface.

According to the semiconductor device pertaining to the embodiment, the width of the hollow space in the U-shaped connection terminal 50a in a non-contact state with the conductive block 40a is set to a value that is equal to or slightly less than the diameter of the circle implemented by the projecting portion 43a of the conductive block 40a. Therefore, when the hollow space is fitted to the projecting portion 43a and the hollow space is pressed and widened by the projecting portion 43a, the inner surface of the hollow space closely adheres to the outer surface of the projecting portion 43a and the unity of the conductive block 40a and the connection terminal 50a is improved.

According to the semiconductor device pertaining to the embodiment, in a state in which the connection terminal 50a is fitted to the conductive block 40a, the hollow space is pressed and widened by the projecting portion 43a and the side wall of the connection terminal 50a contacts with the narrow constriction 61c in the pair of supporting side-walls 61a, 61b and the inner walls of the narrow portion 61 are pressed such that the widening of the connection terminal 50a is prevented. In the contacting site to the conductive block 40a, contact pressure to press the inner surface of the connection terminal 50a against the projecting portion 43a is increased by the pressing force from the narrow portion 61. Therefore, the unity of the conductive block 40a and the connection terminal 50a is further improved.

According to the semiconductor device pertaining to the embodiment, the dimensions of the connection terminal 50a and the conductive block 40a are set such that the connection terminal 50a contacts to only the outer surface corresponding to the upper half of the circle implemented by the projecting portion 43a of the conductive block 40a. Therefore, for example, when the upper circuit board 30 is separated from the casing 60 for repair, and then, the force applied to the connection terminal 50a from the upper side is removed, elastic force to close the hollow space in the U-shaped connection terminal 50a is generated. The elastic force makes it possible to separate the connection terminal 50a from the conductive block 40a, to displace the connection terminal 50a upward, and to smoothly release the fitting. After repair, the casing 60 and the connection terminal 50a can be reused.

<Method for Manufacturing Semiconductor Device Using Casing>

Next, a method for manufacturing the semiconductor device illustrated in FIGS. 1 to 3 will be described, using two semiconductor chips 20a, 20b as an example, with reference to FIGS. 4 to 9. For convenience of explanation, the description of reference numerals for the semiconductor chip 20b of two semiconductor chips 20a, 20b will be omitted.

Figure 4:
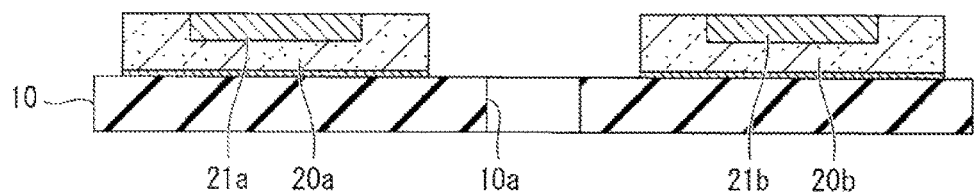
FIG. 4 is a process-flow cross-sectional view illustrating a method for manufacturing the semiconductor device pertaining to the embodiment of the present invention.

First, the insulating substrate 10 having the surface on which a predetermined area has been subjected to solder-plating by, for example, a printing technique is prepared. As illustrated in FIG. 4, the two semiconductor chips 20a, 20b and other predetermined components are mounted on the insulating substrate 10. A fixing through-hole 10a for fixing the insulating substrate 10 to the casing 60 in a later scheduled process is provided at the center of the insulating substrate 10.

Figure 5:
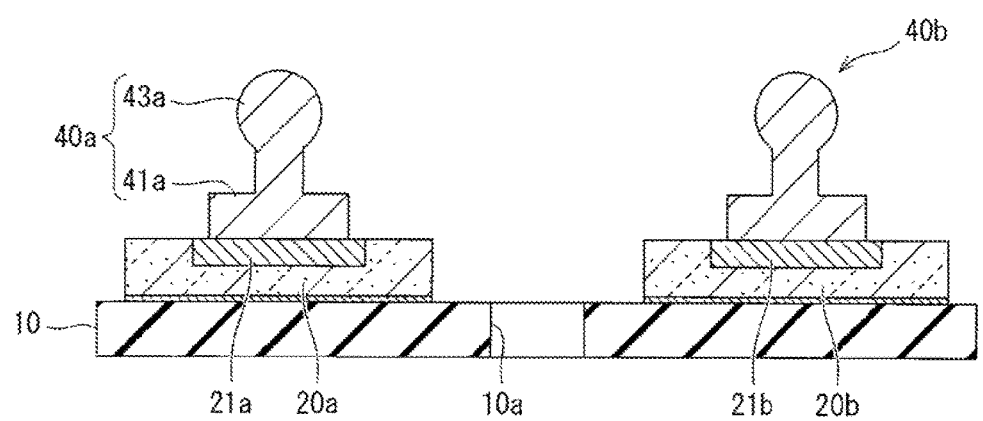
FIG. 5 is a subsequent process-flow cross-sectional view illustrating the method for manufacturing the semiconductor device pertaining to the embodiment, after the process stage illustrated in FIG. 4.

Then, a solder-plating is performed on the surfaces of the output electrodes 21a, 21b of the two semiconductor chips 20a, 20b by, for example, a printing technique. Then, as illustrated in FIG. 5, the conductive blocks 40a, 40b are mounted on the surfaces of the output electrodes 21a, 21b. The plating process is performed such that the shape of plating areas on the output electrodes 21a, 21b is the same as the shape of the bottom surfaces of the conductive blocks 40a, 40b. In addition, the solder-plating is performed on the surfaces of the open-emitter electrode and the gate electrode. Then, for example, lead frames are mounted on the surface. Then, for example, soldering is performed using nitrogen gas and a predetermined cleaning process is executed.

Then, as illustrated in FIG. 6, the casing 60, in which two connection terminals 50a and 50b corresponding to two semiconductor chips 20a, 20b are supported and suspended by a pair of corresponding supporting side-walls 61a, 61b, is prepared. A fixing through-hole 60a, configured to fix the casing 60 to the insulating substrate 10 in a later scheduled process, is provided at the center of the ceiling wall 60t of the casing 60. Then, an adhesive using, for example, thermohardening resin is coated on at least one of the portions of the insulating substrate 10 and the inner surface of the casing 60, which will be bonded each other.

Figure 7:
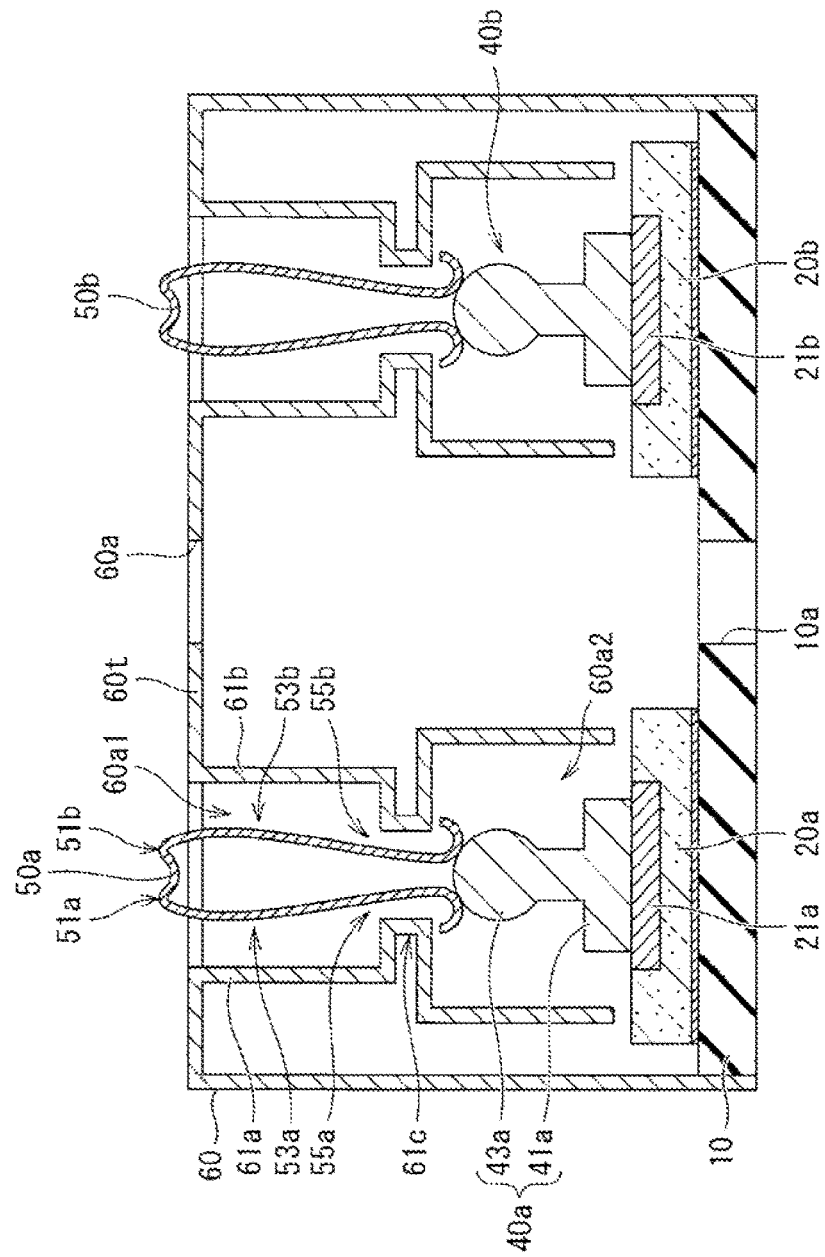
FIG. 7 is a subsequent process-flow cross-sectional view illustrating the method for manufacturing the semiconductor device pertaining to the embodiment, after the process stage illustrated in FIG. 6.

Then, when the casing 60 is fitted from upper side to the insulating substrate 10 as illustrated in FIG. 7, the lower end of the connection terminal 50a is pressed against the upper part of the projecting portion 43a of the conductive block 40a, and the lower part of the connection terminal 50a contact to the projecting portion 43a from both sides. A first-stage bonding between the connection terminal 50a and the conductive block 40a is ensured by the contact. In addition, the upper part of the connection terminal 50a protrudes from the window of the ceiling wall 60t of the casing 60. A first-stage bonding between the connection terminal 50b and the conductive block 40b is ensured similarly as the first-stage bonding between the connection terminal 50a and the conductive block 40a.

Figure 8:
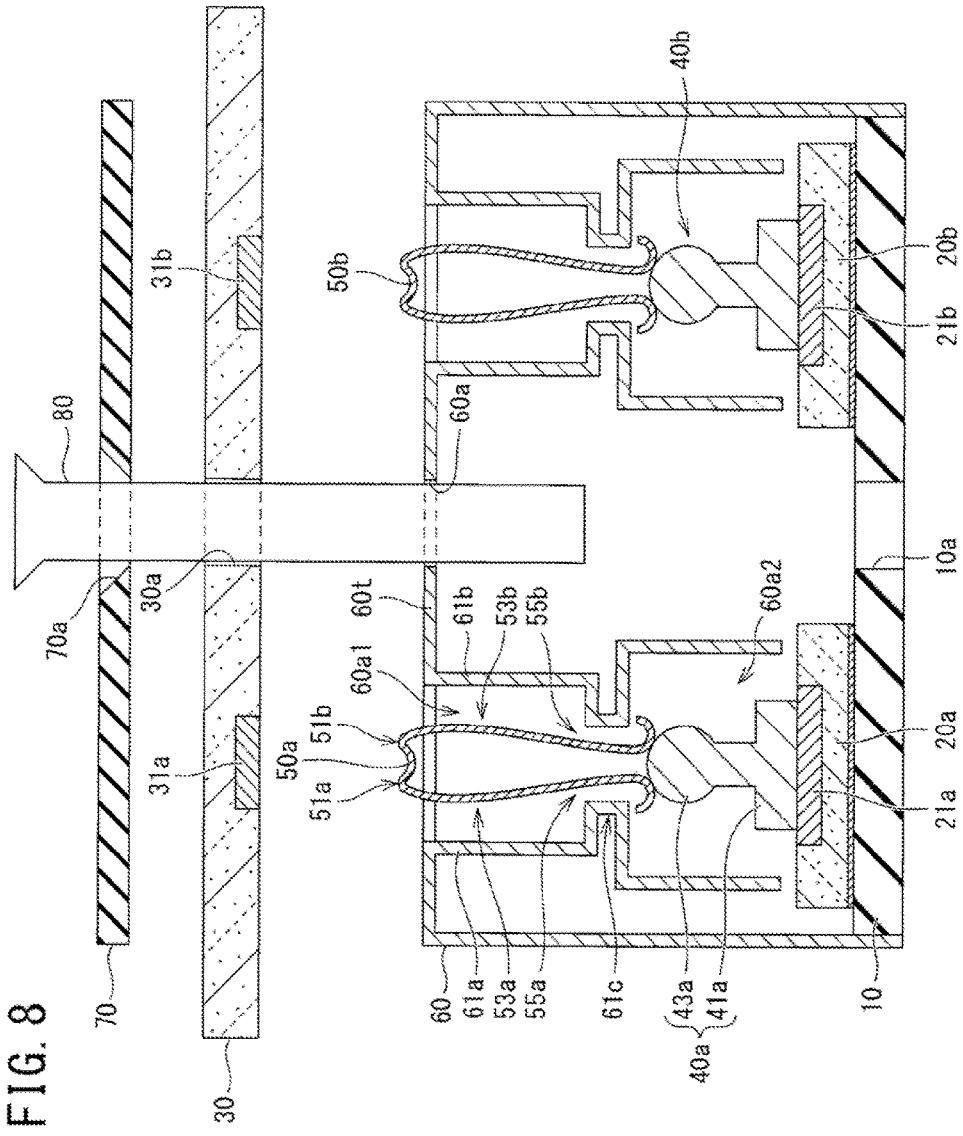
FIG. 8 is a subsequent process-flow cross-sectional view illustrating the method for manufacturing the semiconductor device pertaining to the embodiment, after the process stage illustrated in FIG. 7.

Then, as illustrated in FIG. 8, the circuit board 30 and a cover member 70 which will be assembled with the insulating substrate 10 are disposed on the ceiling wall 60t of the casing 60 so as to overlap the ceiling wall 60t. A fixing through-hole 30a is provided at the center of the circuit board 30, and a fixing through-hole 70a is provided at the center of the cover member 70. Then, a fixing bolt 80 is inserted into the fixing through-holes 10a of the insulating substrate 10, the fixing through-hole 60a of the casing 60, the fixing through-hole 30a of the circuit board 30, and the fixing through-hole 70a of the cover member 70 to fix the insulating substrate 10, the casing 60, the circuit board 30, and the cover member 70, by tightening together these components as illustrated in FIG. 9.

Figure 9:
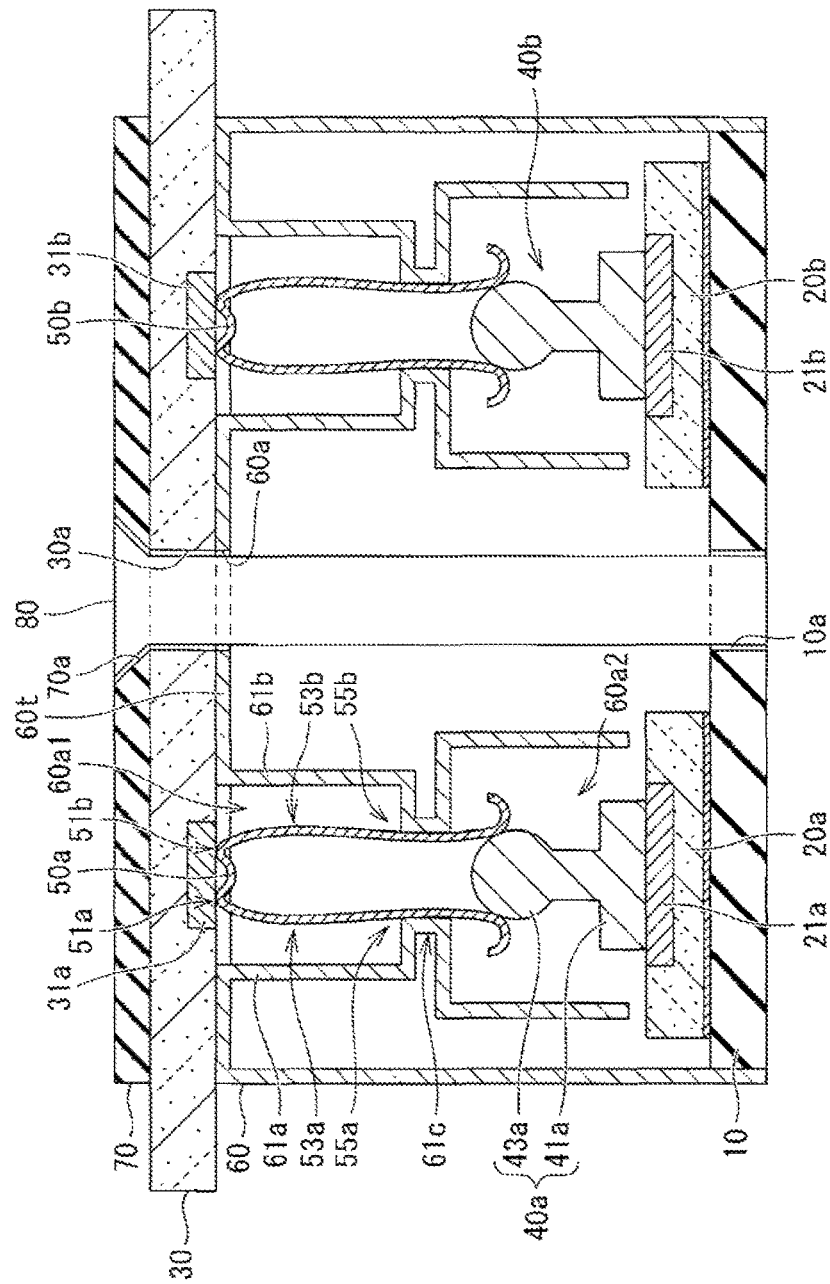
FIG. 9 is a subsequent process-flow cross-sectional view illustrating the method for manufacturing the semiconductor device pertaining to the embodiment, after the process stage illustrated in FIG. 8.

As illustrated at left side of FIG. 9, the surface of the left land 31a in the circuit board 30 contacts from the upper side to the upper part of the connection terminal 50a. The connection terminal 50a protrudes from the window of the ceiling wall 60t of the casing 60. The circuit board 30 presses the connection terminal 50a downwards from the upper side. The surface of the right land 31b in the circuit board 30 contacts to the upper part of the connection terminal 50b on the right side of FIG. 9 from the upper side and the circuit board 30 presses the connection terminal 50b from the upper side.

When the connection terminal 50a moves down, the first slide portion 55a and the second slide portion 55b will slide on the inner surfaces of the narrow constriction 61c in the pair of supporting side-walls 61a, 61b. Then, the connection terminal 50a is pressed and fitted to the upper part of the projecting portion 43a of the conductive block 40a while the hollow spaces in the U-shaped connection terminal 50a is pressed and widened. Second-stage bonding that firmly unifies the connection terminal 50a and the conductive block 40a is achieved by the fitting. Second-stage bonding between the connection terminal 50b and the conductive block 40b is achieved similarly as the second-stage bonding between the connection terminal 50a and the conductive block 40a.

Then, the adhesive between the insulating substrate 10 and the casing 60 is hardened to strongly bond the insulating substrate 10 and the casing 60. Then, protective filler, such as silicon gel or an epoxy resin, flows into the casing 60 and is hardened to a predetermined degree of hardness and the casing 60 is sealed. By the above-mentioned series of processes, a semiconductor device in which the electrical connections between the output electrodes 21a, 21b of the semiconductor chips 20a, 20b and the lands 31a, 31b of the circuit board 30 are reliably achieved by the conductive blocks 40a, 40b and the connection terminals 50a and 50b, respectively, can be manufactured.

According to the method for manufacturing the semiconductor device pertaining to the embodiment, the use of the casing illustrated in FIG. 6 facilitates an easy assembling process of a semiconductor device, without using wire bonding. Therefore, it is possible to reduce the number of manufacturing processes and to reduce investment in facilities related to the manufacture of the semiconductor device.

In the method for manufacturing the semiconductor device pertaining to the embodiment, the plating process is performed such that the shape of the plating area on the output electrodes 21a, 21b is the same as the shape of the bottom surface of the conductive blocks 40a, 40b. Therefore, it is possible to prevent the rotation of the conductive blocks 40a, 40b during soldering.

The swelling portion (53a, 53b) of the connection terminal 50a of the casing of the semiconductor device pertaining to the embodiment protrudes from the narrow constriction 61c in the pair of supporting side-walls 61a, 61b in the width direction. Therefore, when the connection terminal 50a is inserted into the casing 60 from the first containment space 60a1 side, the swelling portion (53a, 53b) is caught in the narrow constriction 61c and the connection terminal 50a does not fall downward and is supported by the narrow constriction 61c. When the connection terminal 50a is supported by the pair of supporting side-walls 61a, 61b, the unity of the connection terminal 50a and the casing 60 is ensured even before the insulating substrate 10 is bonded. Similarly, the unity of the connection terminal 50b and the casing 60 is ensured even before the insulating substrate 10 is bonded. As a result, handling ability of the semiconductor device is improved.

In the portions forming the narrow constriction 61c in the pair of supporting side-walls 61a, 61b in the casing 60 pertaining to the embodiment, while a pair of inner surfaces are facing in parallel along the direction in which the output terminal 21a extends, the pair of inner surfaces extend toward the vertical direction with a predetermined distance. Therefore, when the casing 60 is combined with the insulating substrate 10, the pair of inner surfaces of the narrow constriction 61c contacts to the outer wall surfaces of the connection terminal 50a and guide for sliding of the connection terminal 50a in the vertical direction. Since the narrow constriction 61c function as guide members for guiding the slide of the connection terminal 50a, it is possible to smoothly fit the connection terminals 50a to the conductive block 40a. Similarly, it is possible to smoothly fit the connection terminals 50b to the conductive block 40b.

Other Embodiments

The present invention has been described above with reference to the disclosed embodiment. However, the description and the drawings constituting a portion of the disclosure are not intended to limit the present invention. Various substitutions, modifications, and assembling techniques can be made by those skilled in the art from the disclosure.

Figure 10:
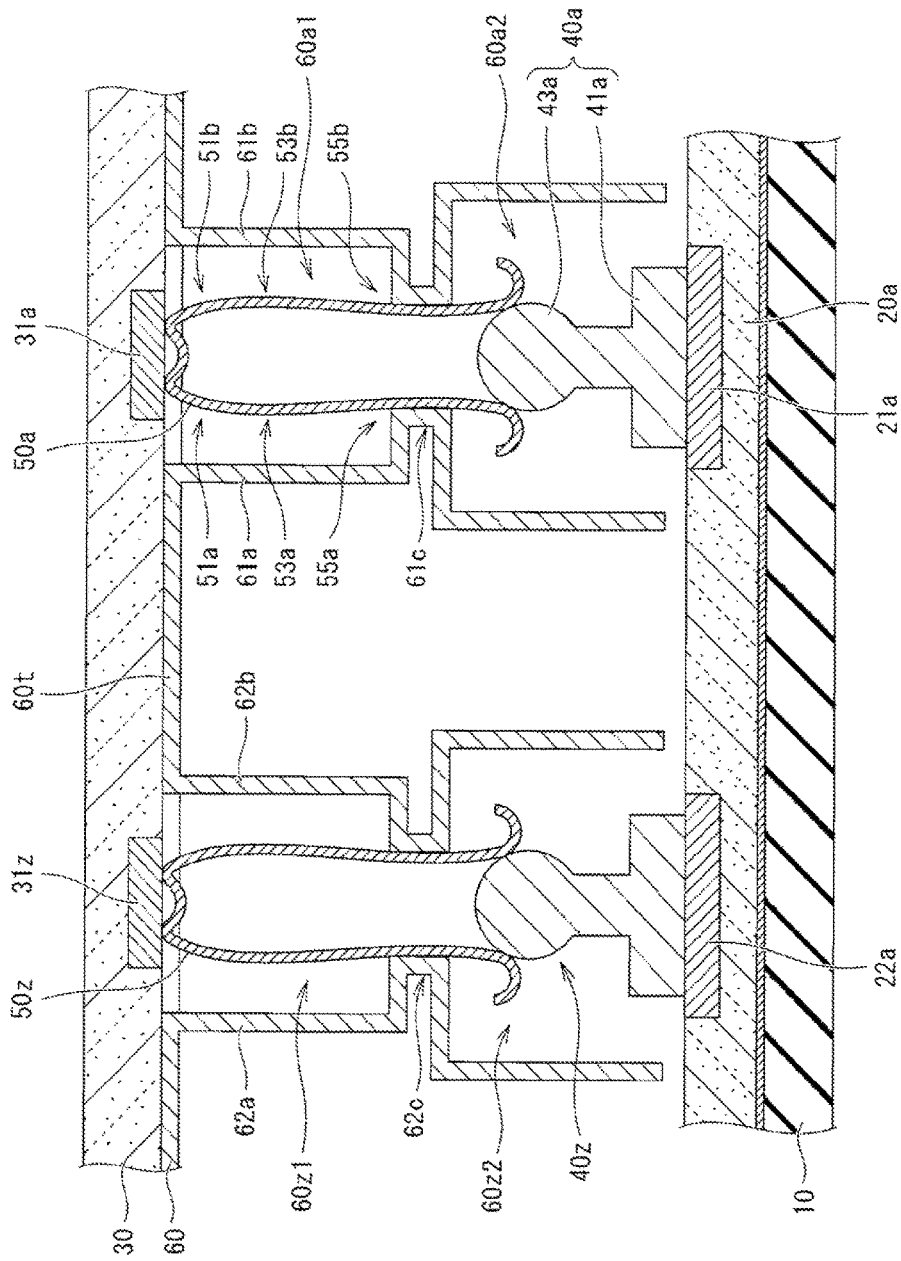
FIG. 10 is a cross-sectional view schematically illustrating the outline of the structure of a semiconductor device according to another embodiment of the present invention.

For example, as illustrated in FIG. 10, a conductive block 40z may be provided on the open-emitter electrode 22a adjacent to the output electrode 21a of the semiconductor chip 20a. The conductive block 40z on the open-emitter electrode 22a has the same structure as the conductive block 40a on the output electrode 21a. In addition, a plating process is performed such that the shape of a plating area on the open-emitter electrode 22a is the same as a bottom surface of the conductive block 40z, similarly to the output electrode 21a.

A pair of supporting side-walls 62a, 62b is provided above the open-emitter electrode 22a and a first containment space 60z1 and a second containment space 60z2 are provided between the pair of supporting side-walls 62a, 62b. Narrow constriction 62c is formed at the centers of the pair of supporting side-walls 62a, 62b in the vertical direction.

The pair of supporting side-walls 62a, 62b above the open-emitter electrode 22a has the same structure as the pair of supporting side-walls 61a, 61b above the output electrode 21a. In addition, a connection terminal 50z having the same structure as the connection terminal 50a on the output electrode 21a is provided between the conductive block 40z and a land 31z of the circuit board 30.

In the case of the semiconductor device illustrated in FIG. 10, it is possible to reduce the installation area of the connection terminal 50z for an open emitter, in addition to the installation area of the connection terminal 50a for output, similarly to the semiconductor device described in FIGS. 1 to 9. Therefore, it is possible to downsize the semiconductor device and to increase current density. The other effectiveness of the semiconductor device illustrated in FIG. 10 are the same as the effectiveness of the semiconductor device described in FIGS. 1 to 9.

In addition, in the example of the semiconductor device illustrated in FIG. 2, six semiconductor chips 20a~20f are provided in one casing 60. However, the present invention is not limited to the six semiconductor chips. The number of semiconductor chips may be appropriately changed. For example, two or four semiconductor chips may be provided. In addition, the arrangement pattern of a plurality of semiconductor chips 20a~20f in the casing 60 is not limited to the topology illustrated in FIG. 2.

The pair of supporting side-walls 61a, 61b of the casing 60 used in the semiconductor device pertaining to the embodiment are formed by bending a plate-shaped member with a substantially constant thickness so as to implement a crankshaft shape in a cross-sectional view, and thereby, the narrow constriction 61c are formed at the middles of the pair of supporting side-walls 61a, 61b in the vertical direction. However, the structure of the narrow portion is not limited to the configuration of the narrow constriction. For example, in a state that the outer wall surfaces of the pair of supporting side-walls 61a, 61b are parallel and vertical, the narrow portion may be formed by changing the thickness of a portion forming the narrow portion such that the thickness of an inner part is larger than that other portions in the vertical direction and reducing the distance between the inner walls. That is, the cross-sectional shape of the pair of supporting side-walls 61a, 61b is not limited to the crankshaft shape and the pair of supporting side-walls 61a, 61b may be designed such that the width between the pair of supporting side-walls 61a, 61b is not uniform in the vertical direction.

In FIGS. 1 to 10, the RC-IGBT has been described as an example of the semiconductor elements which are the semiconductor chips 20a~20f. However, the present invention is not limited to the RC-IGBT. For example, various types of semiconductor elements, such as a MOSFET and a diode, can be used as long as they are used in a semiconductor module, and as long as the electrical connections between the separated substrates are required from each other. However, when the present invention is applied to the RC-IGBT in which IGBT and FWD are integrated into one chip, the effectiveness of the present invention can be maximized.

As described above, the present invention includes, for example, various embodiments that are not described above and the technical scope of the present invention is defined only by specific matters related to the appropriate claims of the present invention.

What is claimed is:

1. A semiconductor device for electrical connection to a circuit board having a first land, comprising:
   a box-shaped casing including a ceiling wall, on which the circuit board is placed, the ceiling wall being provided with a first window at a position corresponding to the first land;
   a semiconductor chip assembled in the casing, the semiconductor chip having an output electrode;
   a first conductive block disposed in the casing, a lower end of the first conductive block being connected to a surface of the output electrode;
   a first connection terminal being bent so as to implement an elongated U-shape in a cross-sectional view, configured to provide a pair of opposite surfaces in the U-shape, the first connection terminal being scheduled to be connected to the first land through an upper end implemented by a bottom of the U-shape via the first window, both sides of an upper part of the first conductive block being interposed between the opposite surfaces at a lower end implemented by a top of the U-shape, the first connection terminal contacting to the first conductive block through the opposite surfaces; and a pair of supporting side-walls fixed to the casing, the supporting side-walls covering the first connection terminal except the upper end in the casing, wherein the supporting side-walls establish a narrow constriction at a position higher than a contact site between the first connection terminal and the first conductive block, the narrow constriction defines a smallest width between the pair of supporting side-walls, and at the narrow constriction, the supporting side-walls contact to the first connection terminal from both sides of the first connection terminal so that the first conductive block presses against inner walls of the first connection terminal.

2. The semiconductor device according to claim 1, wherein a swelling portion is provided in the U-shape, a width measured at the same height position between outer surfaces of the swelling portion is larger than a width of the narrow constriction.

3. The semiconductor device according to claim 1, wherein two or more contact protrusions, which project toward the first land, are provided at an upper end of the first connection terminal, side by side along the width direction.

4. The semiconductor device according to claim 1, wherein the first connection terminal is a single plate bent into the U-shape.

5. The semiconductor device according to claim 1, wherein the first conductive block has:
a base portion having a bottom surface extending along a surface of the output electrode; and
a projecting portion protruding from the base portion toward the first connection terminal,
wherein the bottom surface is bonded to the surface of the output electrode, and both sides of the projecting portion are interposed between the opposite surfaces so that the projecting portion contacts to the opposite surfaces.

6. The semiconductor device according to claim 1, further comprising an insulating substrate configured to mount the semiconductor chip,
wherein a bottom opening of the casing is closed by the insulating substrate.

7. The semiconductor device according to claim 1, further comprising:
a second conductive block disposed in the casing; and
a second connection terminal being bent so as to implement an elongated second U-shape in a cross-sectional view, configured to provide a pair of second opposite surfaces in the second U-shape,
wherein the circuit board has a second land,
the semiconductor chip has an open-emitter electrode,
the casing of the semiconductor device has a second window provided at a position corresponding to the second land of the ceiling wall, a lower end of the second conductive block is connected to a surface of the open-emitter electrode,
the second connection terminal is scheduled to be connected to the second land through an upper end implemented by a bottom of the second U-shape via the second window, and both sides of an upper part of the second conductive block are interposed between the second opposite surfaces at a lower end implemented by a top of the U-shape and the second connection terminal contacts to the second conductive block through the second opposite surfaces.

8. The semiconductor device according to claim 1, wherein the semiconductor chip is a reverse-conducting insulated-gate bipolar transistor.

9. A casing of a semiconductor device for electrically connecting the semiconductor device to a circuit board having a land, comprising:
a box-shaped outer wall including a ceiling wall on which the circuit board is placed, the ceiling wall being provided with a window at a position corresponding to the land;
a connection terminal being bent so as to implement an elongated U-shape in a cross-sectional view, configured to provide a pair of opposite surfaces in the U-shape, the connection terminal being scheduled to be connected to the land through an upper end implemented by a bottom of the U-shape via the window, the connection terminal being adapted for connecting to a semiconductor chip, which is scheduled to be mounted in the outer wall through the opposite surfaces at a lower end implemented by a top of the U-shape; and
a pair of supporting side-walls fixed to the outer wall, the supporting side-walls facing each other, the supporting side-walls covering the connection terminal except the upper end in the outer wall, the supporting side-walls establishing a narrow constriction, which defines a smallest width between the pair of supporting side-walls, and the supporting side-walls supporting the connection terminal through the narrow constriction.

10. A semiconductor device for electrical connection to a circuit board having a first land, comprising:
a box-shaped casing including a ceiling wall, on which the circuit board is placed, the ceiling wall being provided with a first window at a position corresponding to the first land;
a semiconductor chip assembled in the casing, the semiconductor chip having an output electrode;
a first conductive block disposed in the casing, a lower end of the first conductive block being connected to a surface of the output electrode; and
a first connection terminal being bent so as to implement an elongated U-shape in a cross-sectional view, configured to provide a pair of opposite surfaces in the U-shape, the first connection terminal being scheduled to be connected to the first land through an upper end implemented by a bottom of the U-shape via the first window, both sides of an upper part of the first conductive block being interposed between the opposite surfaces at a lower end implemented by a top of the U-shape, the first connection terminal contacting to the first conductive block through the opposite surfaces,
wherein two or more contact protrusions, which project toward the first land, are provided at an upper end of the first connection terminal, side by side along the width direction.

* * * * *